United States Patent
Patzner et al.

(10) Patent No.: US 9,357,656 B2
(45) Date of Patent: May 31, 2016

(54) METHOD FOR SOLDERLESS ELECTRICAL PRESS-FIT CONTACTING OF ELECTRICALLY CONDUCTIVE PRESS-FIT PINS IN CIRCUIT BOARDS

(71) Applicants: Patrik Patzner, Leonberg-Silberberg (DE); Carsten Kaschube, Nuertingen (DE); Christoph Gmelin, Stuttgart (DE); Andreas Otto, Hoerselberg-Hainich (DE); Markus Reinhard, Kornwestheim (DE); Ronny Wolf, Eisenach (DE)

(72) Inventors: Patrik Patzner, Leonberg-Silberberg (DE); Carsten Kaschube, Nuertingen (DE); Christoph Gmelin, Stuttgart (DE); Andreas Otto, Hoerselberg-Hainich (DE); Markus Reinhard, Kornwestheim (DE); Ronny Wolf, Eisenach (DE)

(73) Assignee: Robert Bosch GmbH, Stuttgart (DE)

( * ) Notice: Subject to any disclaimer, the term of this patent is extended or adjusted under 35 U.S.C. 154(b) by 203 days.

(21) Appl. No.: 14/283,989

(22) Filed: May 21, 2014

(65) Prior Publication Data

US 2014/0345124 A1 Nov. 27, 2014

(30) Foreign Application Priority Data

May 22, 2013 (DE) .......................... 10 2013 209 407

(51) Int. Cl.
*H05K 3/30* (2006.01)
*H05K 3/32* (2006.01)
*H05K 1/11* (2006.01)

(52) U.S. Cl.
CPC ................ *H05K 3/325* (2013.01); *H05K 1/115* (2013.01); *H05K 3/308* (2013.01); *H05K 2201/09854* (2013.01); *H05K 2201/1059* (2013.01); *H05K 2201/10856* (2013.01);

(Continued)

(58) Field of Classification Search
CPC ..................... Y10T 29/4913; Y10T 29/49124; Y10T 29/49147; Y10T 29/49822; H01R 12/58; H01R 12/585
USPC .......... 29/837, 825, 838, 842, 844, 845, 852, 29/874; 439/62, 82, 567, 637, 746
See application file for complete search history.

(56) References Cited

U.S. PATENT DOCUMENTS 3,783,433 A * 1/1974 Kurtz ................... H05K 7/1038 439/62
7,445,499 B2 * 11/2008 Nunokawa ........... H01R 12/585 439/567

(Continued)

FOREIGN PATENT DOCUMENTS

DE 93 05 285 6/1993
DE 102 22 200 11/2003

(Continued)

*Primary Examiner* — Thiem Phan
(74) *Attorney, Agent, or Firm* — Norton Rose Fulbright US LLP

(57) ABSTRACT

A method for solderless electrical press-fit contacting of electrically conductive press-fit pins in circuit boards include: providing a circuit board having a thickness, at least one electrical conductor path, and a contacting opening guided perpendicularly through the circuit board and having a metallized inner wall; providing an electrically conductive press-fit pin having a longitudinal axis and having a press-fit region suitable for press-fitting into the contacting opening and having a substantially round cross section; and press-fitting the press-fit pin into the contacting opening by applying onto the press-fit pin a force acting along the longitudinal axis of the press-fit pin, press-fitting being assisted by the application of ultrasound acting on the press-fit pin.

10 Claims, 4 Drawing Sheets

(52) U.S. Cl.
CPC ............... *H05K 2201/10878* (2013.01); *H05K 2203/0285* (2013.01); *Y10T 29/49139* (2015.01)

(56) References Cited

U.S. PATENT DOCUMENTS

2005/0162840 A1 7/2005 Morita
2012/0298730 A1 11/2012 Berchtold

FOREIGN PATENT DOCUMENTS

DE 10 2009 047 043 4/2011
JP 2011 024 393 1/2001
WO WO 2011 155115 12/2011

* cited by examiner

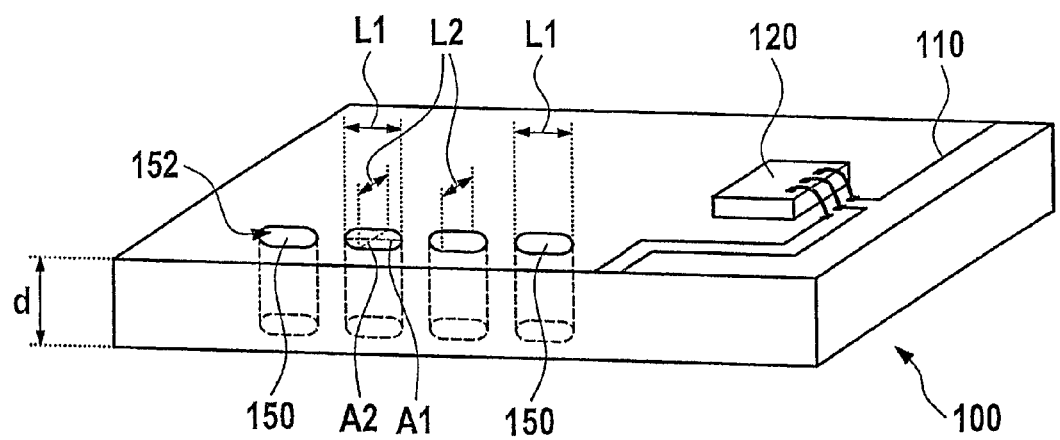
FIG. 1
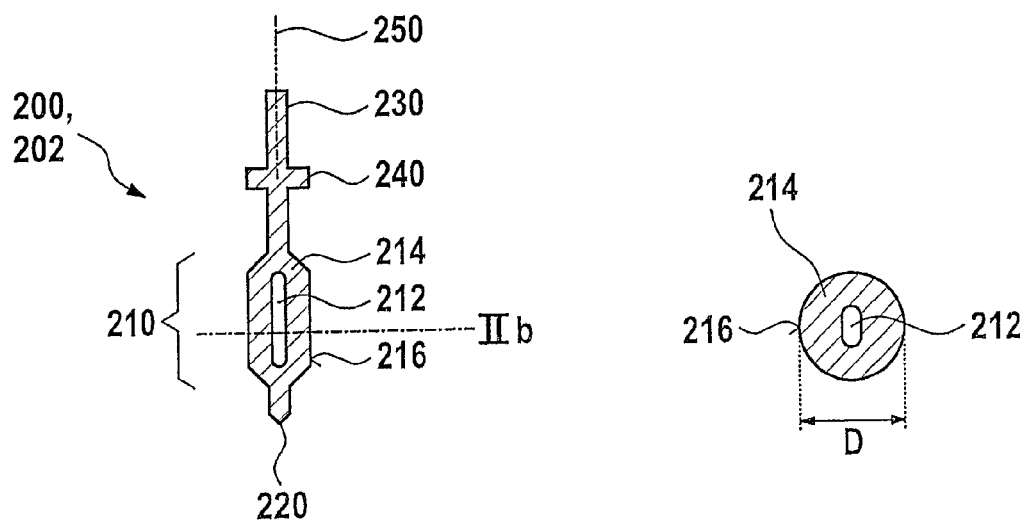
FIG. 2a
FIG. 2b

METHOD FOR SOLDERLESS ELECTRICAL PRESS-FIT CONTACTING OF ELECTRICALLY CONDUCTIVE PRESS-FIT PINS IN CIRCUIT BOARDS

BACKGROUND OF THE INVENTION

1. Field of the Invention

The present invention relates to a method for solderless electrical press-fit contacting of electrically conductive press-fit pins in circuit boards.

2. Description of the Related Art

Press-fit connections for direct contacting of circuit boards are utilized in numerous products. The range of variants extends from individual press-fit pins in onboard computers to edge connectors having up to approx. 100 press-fit pins in control units. With a large number of press-fit pins to be pressed in, requirements become more stringent in terms of the accuracy of the spacings and the orientation of the press-fit pins with respect to one another, the contacting openings in the circuit board, and the positioning of the press-fit pins before and during the press-fitting operation with respect to the contacting openings.

A press-fit pin, or an edge connector having a plurality of press-fit pins, is usually press-fitted into a contacting opening or into a plurality of contacting openings of the circuit board. The contacting opening is often equipped with a press-fit sleeve. The diameter of the press-fit sleeve in the circuit board is as a rule recommended by the supplier of the press-fit pins. The design of the press-fit sleeve depends on the hardness, the geometry, and the utilization of the press-fit pins. As the press-fit pin is press-fitted into the press-fit sleeve, the inner wall of the press-fit sleeve becomes plastically deformed and a frictionally engaged connection is achieved between the press-fit pin and the press-fit sleeve.

The demands in terms of the location and positional accuracy of the press-fit pins with regard to the contacting openings in the context of the press-fitting operation are stringent in order to avoid tilting of the press-fit pins and in order to minimize press-fitting forces. Excessively high press-fitting forces or tilting of the press-fit pins in the press-fitting operation can damage the press-fit sleeve of the contacting opening, or even the circuit board.

Published Japanese patent document JP 2001 024393 discloses that press-fit pins can be press-fitted into a circuit board, in which context the press-fitting operation can be assisted with ultrasound.

BRIEF SUMMARY OF THE INVENTION

The present invention proposes a method for solderless electrical press-fit contacting of electrically conductive press-fit pins in circuit boards. The method according to the present invention for solderless electrical press-fit contacting of electrically conductive press-fit pins in circuit boards encompasses the following steps: furnishing a circuit board, the circuit board having a thickness (d), the circuit board having at least one electrical conductor path, and the circuit board having at least one contacting opening guided perpendicularly through the circuit board, which opening is provided for electrical press-fit contacting of the press-fit pin, the contacting opening having a metallized inner wall, in particular a completely metallized inner wall; and furthermore a step of furnishing at least one electrically conductive press-fit pin having a longitudinal axis and having a press-fit region suitable for press-fitting into the contacting opening, the press-fit region having a substantially round cross section. Lastly, the press-fit pin is press-fitted into the contacting opening by applying onto the press-fit pin a force acting along the longitudinal axis of the press-fit pin into the circuit board. According to the present invention, the contacting opening has a shape deviating from a round shape, having a first inside diameter and a second inside diameter, the second inside diameter being smaller than the first inside diameter and the ratio of the first inside diameter to the second inside diameter being greater than 1.2 and particularly preferably greater than 1.5, the press-fit region of the press-fit pin having, along its longitudinal axis over an axial length of at least 50% of the thickness of the circuit board, an outside diameter that exceeds the second inside diameter of the contacting opening before the press-fitting step, and is smaller than the first inside diameter.

The method according to the present invention for solderless electrical press-fit contacting of electrically conductive press-fit pins in circuit boards has the advantage, with respect to the existing art, that as a result of the press-fitting of the press-fit pins into the oblong-hole-like contacting opening, the demands in terms of positioning accuracy of the press-fit pin above the contacting opening are appreciably reduced, so that production reliability and yield can be increased and costs can be reduced. In addition, the stress introduced into the circuit board is advantageously reduced by the oblong-hole-like contacting openings, with the result that the service life of the contact and of the circuit board increases, and the number and density of the press-fit pins on the circuit board can be raised. Particularly advantageously, the number of pins that can be press-fitted simultaneously into the circuit board can thereby be increased, which shortens the production cycle time.

The advantageous result of the fact that the press-fit pin is elastically or permanently deformable in a radial direction is that the press-fit force can be further reduced, and the risk of damaging the contacting opening, as well as the stress introduced into the circuit board, can thereby be reduced.

The advantageous result of the fact that the electrical contact between the press-fit pin and the inner wall of the contacting opening has, after press-fitting, an electrical contact resistance of less than 50 μohm (microohms), in particular less than 10 μohm (microohms), is that a defect in press-fitting can be particularly easily detected electrically by way of an increase in the contact resistance to more than 1 mohm (milliohms), particularly advantageously to more than 10 mohm (milliohms).

In a refinement of the invention, a component having a plurality of press-fit pins is furnished, the plurality of press-fit pins being disposed in at least one row. Furthermore in this refinement, a circuit board is furnished which has a number of contacting openings that corresponds at least to the number of press-fit pins of the component, the first inside diameter of the contacting openings being disposed respectively in the extension direction of the at least one row of press-fit pins. The advantageous result of this is that fitting of the plurality of press-fit pins is simplified to a particular degree, since the positioning accuracy and spacing of the press-fit pins with respect to one another can exhibit a higher tolerance than with the conventional design of the contacting opening, and at the same time a sufficient mechanical and electrical contact is ensured. Particularly advantageously, a cost reduction is achieved because of the resulting reduction in dimensional consistency requirements for the plurality of press-fit pins. Particularly advantageously, for example, the use of multiple plug-in systems having different press-fit pin spacings from one another is also made possible with only one circuit board.

In an advantageous refinement of the invention, the at least one press-fit pin is press-fitted into the contacting opening obliquely to a direction extending perpendicular to the circuit board, the at least one press-fit pin being pressed obliquely into the contacting opening in particular at an angle of between 10° and 80° with respect to a direction extending perpendicular to the circuit board. The advantageous result of this is that the requirements for positioning accuracy and press-fit accuracy in the context of the press-fitting operation can be reduced, thereby advantageously yielding a cost saving and a reduction in the mechanical stress introduced into the circuit board. Particularly advantageously, the oblique press-fitting of the press-fit pins enables an increase in the installation space, and enables contacting of contacts disposed laterally on the circuit board. Particularly advantageously, the oblique press-fitting of the press-fit pins allows an appreciable increase in the electrical and mechanical attachment zone, i.e. the region in which the at least one press-fit pin and the inner wall of the contacting opening are in electrical and mechanical contact.

The advantageous result of the fact that the metallization of the inner wall of the at least one contacting opening has at least 25 μm of copper at every point is that a particularly reliable frictionally engaged connection between the press-fit pin and the at least one contacting opening, and a particularly reliable electrical contact, can be created. This results from the high electrical conductivity of copper and the particularly high ductility of copper.

The advantageous result of the fact that the topmost layer of the metallization of the at least one contacting opening is made of tin is that the press-fitting operation can be carried out with particularly little force, since tin particularly assists the insertion of the press-fit pins because it is readily deformable.

The advantageous result of the fact that the at least one contacting opening is expanded by press-fitting, the second inside diameter of the at least one contacting opening being at least locally enlarged, the second inside diameter being enlarged by at most 100 μm, is that the stress introduced into the circuit board can be minimized and at the same time secure mechanical and electrical contacting between the outer wall of the press-fit pin and the inner wall of the at least one contacting opening is produced.

The advantageous result of the fact that press-fitting is assisted by the application of ultrasound acting on the press-fit pin is that press-fitting of the press-fit pin into the contacting opening can occur with appreciably less exerted force as compared with press-fitting without ultrasound assistance. Particularly advantageously, the force required can thereby be decreased by at least 10%, preferably by at least 20%, particularly preferably by at least 30%. Particularly advantageously, the stress introduced into the circuit board upon press-fitting is thereby also decreased, and a more durable and more secure connection between the press-fit pin and the contacting opening is created.

The fact that as a result of the application of ultrasound upon press-fitting, a friction weld is produced at least locally between the outer wall of the at least one press-fit pin and the inner wall of the at least one contacting opening advantageously creates a particularly robust electrical and mechanical contact between the at least one press-fit pin and the at least one contacting opening. The electrical contact resistance advantageously drops as a result, and remains permanently low. The friction weld furthermore advantageously supplements the frictionally engaged connection between the at least one press-fit pin and the at least one contacting opening with an intermaterial connection.

BRIEF DESCRIPTION OF THE DRAWINGS

FIG. 1 is a perspective view of a circuit board having contacting openings according to the present invention.

FIG. 2a is a longitudinal section through a press-fit pin.

FIG. 2b is a cross section through the press-fit pin of FIG. 2a.

DETAILED DESCRIPTION OF THE INVENTION

Figure 3:
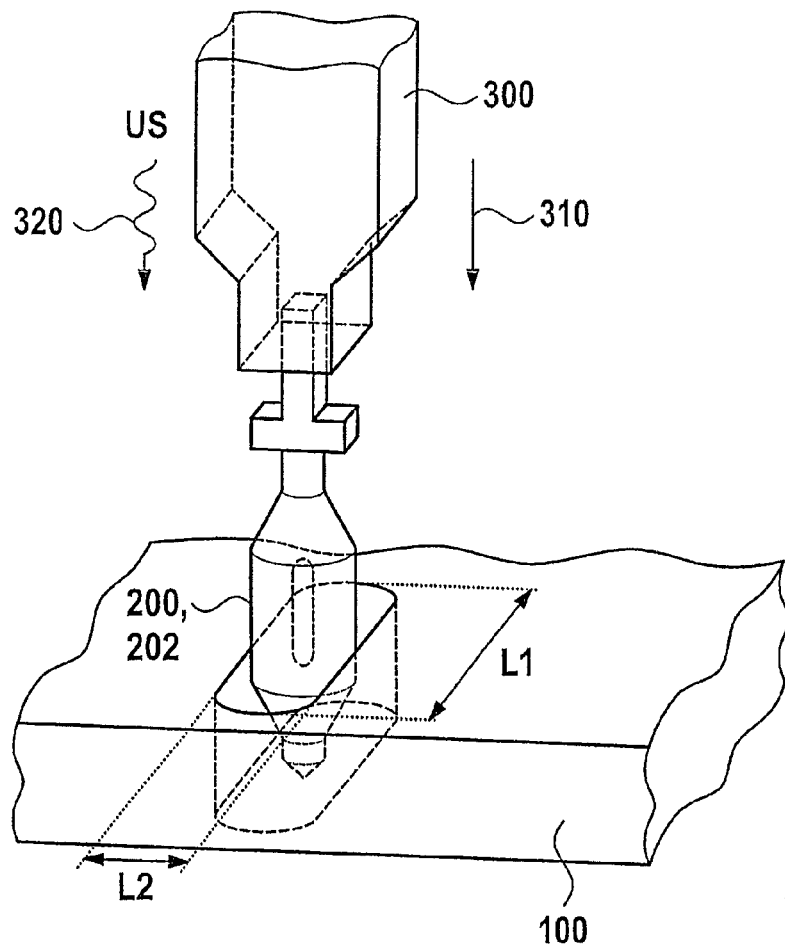
FIG. 3 is a perspective view of a press-fit pin upon press-fitting into a contacting opening according to the present invention of a circuit board.

FIG. 1 depicts a circuit board 100 having multiple contacting openings 150 guided vertically through circuit board 100. Circuit board 100 is embodied in plate-shaped fashion and preferably rigidly, for example as a printed circuit board (PCB), has a thickness (d), for example 1.6 mm or 1.0 mm or another commercially usual thickness (d), and is made, for example, of an FR4 or better material. Circuit board 100 can be embodied in one ply, two plies, or multiple plies. In the exemplifying embodiment depicted, conductor paths 110 as well as an electrical or electronic component 120, for example an application-specific integrated circuit (ASIC), are disposed on the surface of circuit board 100. The electrical or electronic component 120 is connected by way of electrical connecting elements, for example bonding wires, to conductor paths 110. Circuit board 100 can be used, for example, in an electronic control device.

Contacting openings 150 disposed in circuit board 100 have a metallized inner wall 152. The metallization is made, for example, of copper, preferably having a minimum thickness of 25 μm, particularly preferably of copper coated with tin. The metallization can be applied onto inner wall 152 of contacting opening 150, for example, using a galvanic process. It is also conceivable for inner wall 152 of contacting opening 150 to be embodied in the form of a metal sleeve that serves as a press-fit sleeve.

In a plan view onto the circuit board, contacting opening 150 has a shape deviating from a circular shape, for example the shape of an oblong hole. The cross-sectional shape can be embodied as an elliptical shape or a rectangular shape or as a rectangle having rounded edges. The oblong-hole-like contacting opening 150 has a first inside diameter (L1) along a first axis (A1) and a second inside diameter (L2) along a second axis (A2). The ratio of the first inside diameter (L1) to the second inside diameter (L2) is greater than 1.2, preferably greater than 1.5, particularly preferably greater than 2.5.

FIG. 2a is a longitudinal section through a press-fit pin 200 embodied as a flexible press-fit pin 202. Flexible press-fit pin 202 has along its longitudinal axis 250, viewed from bottom to top in the Figure, the following elements: a tip 220, tip 220 being suitable for being introduced into an oblong-hole-like contacting opening 150; a press-fit region 210, press-fit region 210 of flexible press-fit pin 202 having, along longitudinal axis 250 over an axial length of at least 50% of the thickness (d) of circuit board 100, an outside diameter (D)

that exceeds the second inside diameter (L2) of contacting opening 150 prior to press-fitting and is smaller than the first inside diameter (L1). For example, if a circuit board 100 having a thickness (d) of 1.6 mm is used, press-fit region 210 then extends at least over a length of 0.8 mm along longitudinal axis 250.

Flexible press-fit pin 202 furthermore has a contacting opening stop 240 and a pressure application end 230. Upon press-fitting of press-fit pin 200 embodied as flexible press-fit pin 202, contacting opening stop 240 prevents flexible press-fit pin 202 from being pressed through contacting opening 150 farther than desired. For press-fitting of flexible press-fit pin 202 into contacting opening 150, flexible press-fit pin 202 is positioned with its tip 220 above contacting opening 150, and by exertion of a force acting axially along its longitudinal axis 250 onto its pressure application end 230, is pressed into contacting opening 150.

Flexible press-fit pin 202 depicted in the Figure has in its press-fit region 210, viewed radially inward from its outer wall 216, firstly a segment that is made of solid material 214, preferably of a metal. Located in the interior is preferably a cutout 212 in the solid material, thanks to which cutout an elastic deformation of flexible press-fit pin 202 in press-fit region 210 is enabled. By way of this elastic deformability of flexible press-fit pin 202, flexible press-fit pint 202 can be press-fitted into a contacting opening 150 with comparatively little force exertion, and becomes elastically preloaded. As a result of its elastic deformation, flexible press-fit pin 202 then automatically presses against inner wall 152 of the contacting opening and thereby improves mechanical and electrical contact. In another embodiment having rigid press-fit pins 200, the press-fit pin is embodied over its entire cross section as solid material 214. The frictionally engaged connection can then be brought about predominantly by displacement of the metallization of inner wall 152 of contacting opening 150.

FIG. 2b is a cross section through press-fit region 210 of flexible press-fit pin 202 having the outside diameter (D). It is evident from the Figure that upon exertion of a mechanical force onto outer wall 216 of flexible press-fit pin 202, press-fit region 210 is easily deformable in a radial direction as a result of cutout 212. Cutout 212 assists the elastic radial deformation of flexible press-fit pin 202 as compared with a rigid press-fit pin 200 that is made of solid material 214 over its entire cross section. The cross section of flexible press-fit pin 202 that is depicted has a round shape, preferably a circular shape. A "circular" shape is to be understood as a shape such that the diameter of the shape is the same at all points. In the case of the circular shape of the cross section as depicted, the outside diameter (D) of the flexible press-fit pin is identical in size at all points in the cross section depicted, within production tolerances.

It is also possible in principle for the shape of the flexible press-fit pin in cross section to correspond to a polygonal shape (not depicted here), for example that of a regular hexagon or a regular octagon.

FIG. 3 depicts a press-fitting operation. Press-fit pin 200, or flexible press-fit pin 202, is positioned with its tip 220 above contacting opening 150. A pressure application device 300 is set onto pressure application end 230 of flexible press-fit pin 202, and flexible press-fit pin 202 is pressed into contacting opening 150 by a press-fit force 310 acting along its longitudinal axis 250. In the press-fitting operation the metallization of contacting opening 150 becomes plastically deformed and, when a flexible press-fit pin 202 is used, flexible press-fit pin 202 becomes elastically deformed. In this manner, after the press-fitting operation flexible press-fit pin 202 or press-fit pin 200 is connected to contacting opening 150 by a frictionally engaged connection, and is in mechanical and electrical contact with contacting opening 150 at at least two diametrically opposite points on its outer wall 216. Particularly preferably, the thickness of the metallization layer of inner wall 152 of contacting opening 150 after press-fitting is at least 8 μm in cross section at every point.

The press-fitting operation is particularly preferably assisted by the application of ultrasonic waves 320 onto pressure application device 300. Assisting the press-fitting operation with ultrasound 320 brings about a reduction in the required press-fitting force, for example, of at least 10%, preferably at least 20%, particularly preferably at least 30%, as compared with a press-fitting operation without ultrasonic assistance 320. Ultrasonic assistance 320 furthermore increases the holding force of press-fit pin 200 in contacting opening 150, and enhances the robustness of the solderless contact. As a result of the reduced press-fitting force, the number of press-fit pins 200 that can be press-fitted into the circuit board can be increased. As a result of ultrasonic assistance 320 upon press-fitting, it is also unnecessary for press-fit pin 200 to protrude beyond the circuit board. In addition, as a consequence of ultrasonic assistance 320 of the press-fitting process, a frictionally welded connection is achieved between outer wall 216 of flexible press-fit pin 202 and inner wall 152 of contacting opening 150. A larger attachment zone is thereby created between press-fit pin 200 and contacting opening 150 of circuit board 100, which can improve electrical and mechanical contact and result in a gas-tight connection.

Figure 4:
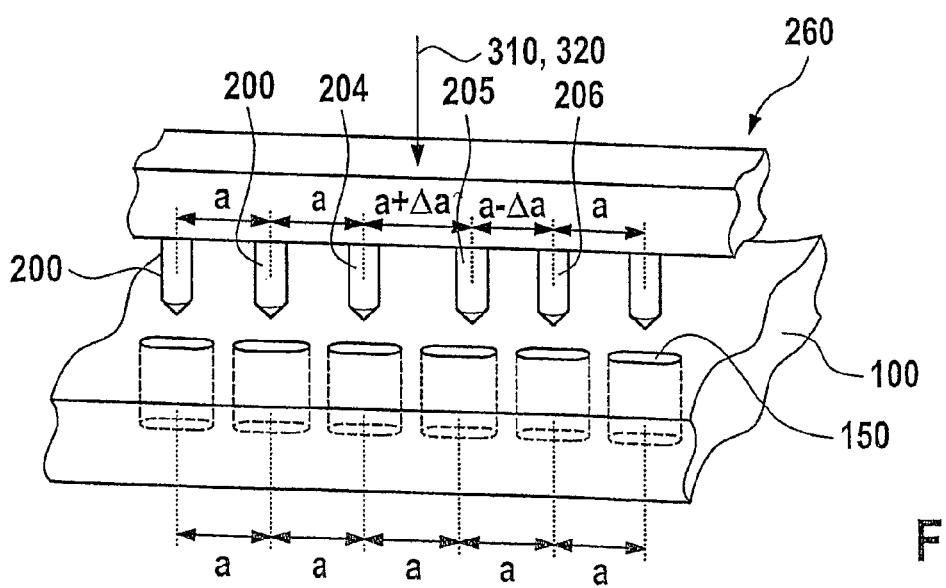
FIG. 4 is a perspective view of a component having a plurality of press-fit pins upon press-fitting into a plurality of contacting openings according to the present invention of a circuit board.

FIG. 4 depicts a further embodiment of the invention. In this embodiment a component 260 is provided which has a plurality of press-fit pins 200. Flexible press-fit pins 202 can also be provided here. Press-fit pins 200 are disposed on component 260 in at least one row one behind another. They are thus at a well-defined reference distance (a) from one another, which is measured as the distance between their longitudinal axes 250. As a consequence of production tolerances, it can happen that the real distance between individual press-fit pins 200 does not correspond to the reference distance (a). For example, the real distance between a first press-fit pin 204 and a second press-fit pin 205 is thus greater than the reference distance (a) by an amount Δa, and is therefore equal to a+Δa. The distance from second press-fit pin 205 to its other neighbor, a third press-fit pin 206, is thus equal to a−Δa.

A number of contacting openings 150 corresponding to the plurality of press-fit pins 200 of component 260 is provided in circuit board 100. Contacting openings 150 are likewise arranged in a row and are at a contacting opening distance (a) from one another, calculated from the center of contacting opening 150, that corresponds to the reference distance of press-fit pins 200 of component 260. Because contacting opening 150 has a shape deviating from a circular shape, and the first, larger inside diameter (L1) is oriented in the extension direction of the row, press-fitting of component 260 is easily possible even if the real distance of press-fit pins 200 from one another deviates more greatly from the reference distance (a) than is possible with conventional contacting openings. In addition, the shape according to the present invention of contacting openings 150 enables press-fitting of component 260, securely and without damage to press-fit pins 200 and to circuit board 100, even with lower positioning accuracies for press-fit pins 200 with respect to contacting openings 150.

Figure 5:
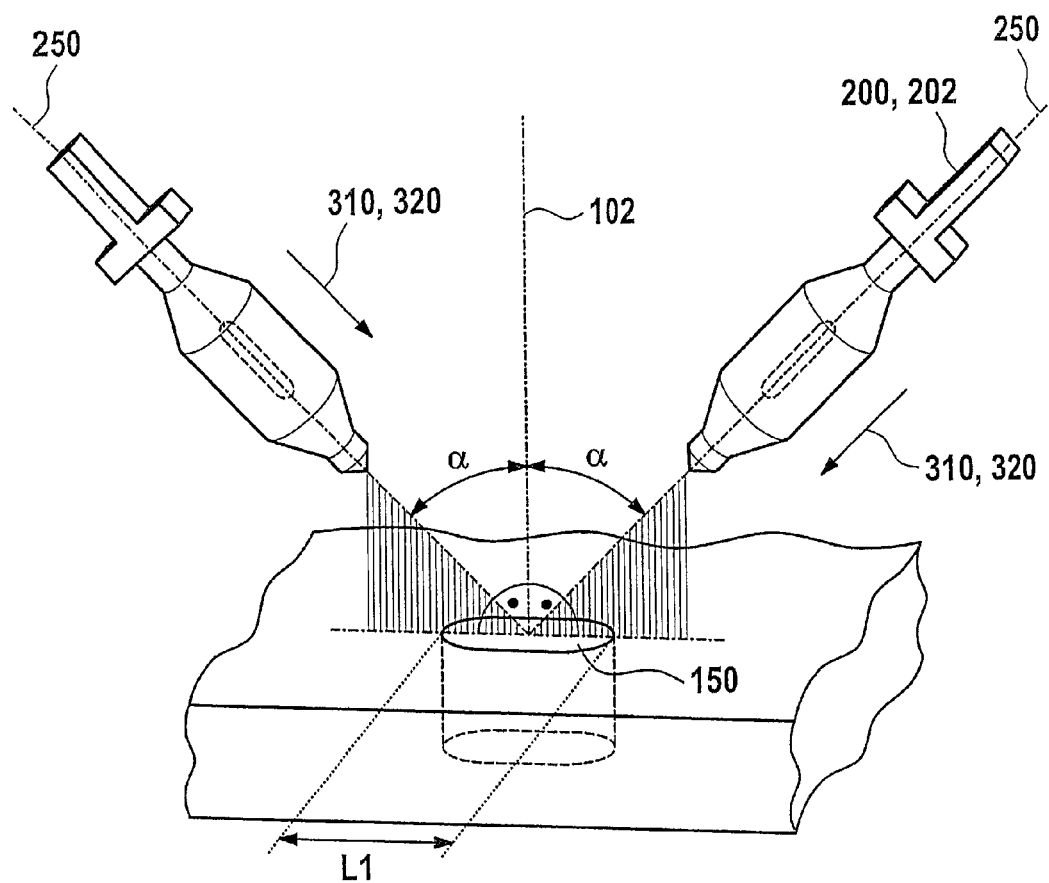
FIG. 5 is a perspective view of press-fit pins upon oblique press-fitting according to the present invention into a contacting opening according to the present invention of a circuit board.

FIG. 5 depicts how the use of a, for example, oblong-hole-like contacting opening 150 in circuit board 100 makes possible oblique press-fitting of press-fit pins 200.

The use of a, for example, oblong-hole-like contacting opening 150 having two different inside diameters (L1, L2) makes it possible to press-fit the press-fit pin 200 or flexible press-fit pin 202 obliquely into contacting opening 150, for example at an angle (α) of between 10° and 80° with respect to a direction 102 perpendicular to circuit board 100. Oblique press-fitting occurs here preferably in a direction whose projection onto circuit board 100 extends substantially parallel to the first axis (A1). Press-fit pin 200 is preferably press-fitted at an angle (α) of between 20° and 70°, particularly preferably at an angle (α) of between 30° and 60° with respect to a direction 102 perpendicular to circuit board 100. For certain applications it is advantageous to carry out oblique press-fitting at an angle (α) of between 15° and 50° with respect to a direction extending perpendicular to circuit board 100.

Oblique press-fitting is particularly preferably carried out with ultrasonic assistance 320. Particularly preferably, flexible press-fit pins 202 are used in the context of oblique press-fitting. These actions allow press-fitting forces 310 to be considerably reduced. Oblique press-fitting also makes possible, for example, contacting of circuit boards in a restricted space, since lateral delivery of press-fit pins 200 to contacting opening 150 of the circuit board is enabled.

Oblique press-fitting furthermore also enlarges the contact area between outer wall 216 of press-fit pins 200 and inner wall 152 of contacting openings 150. Improved electrical and mechanical contact between press-fit pin 200 and contacting opening 150 is thereby produced.

Figure 6:
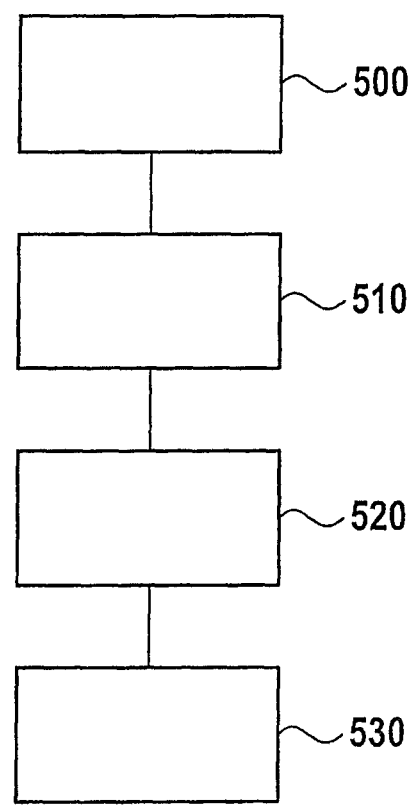
FIG. 6 is a flow chart of the method for solderless electrical press-fit contacting according to the present invention.

FIG. 6 is a flow chart of the method for solderless electrical press-fit contacting of electrically conductive press-fit pins 200 in circuit boards 100. The method encompasses the steps of furnishing 500 a circuit board, the circuit board having at least one contacting opening 150; furnishing 510 a press-fit pin; positioning 520 the at least one press-fit pin 100 above the at least one contacting opening 150 of circuit board 100; and press-fitting 530 the at least one press-fit pin 200 into the at least one contacting opening 150 of circuit board 100.

The method according to the present invention is suitable, for example, for use in the manufacture of products in which solderless electrical contacting is necessary in order to minimize thermal loads in the manufacturing process, for example in the context of electrical or electronic control devices for motor vehicles, for contacting circuit boards for computers, smartphones, tablet PCs, and other consumer electronics devices, or in the manufacture of network plug connectors for high-speed data transfer systems.

What is claimed is:

1. A method for solderless electrical press-fit contacting of at least one electrically conductive press-fit pin in a circuit board, comprising:
    providing a circuit board having a specified thickness, at least one electrical conductor path, and at least one contacting opening guided perpendicularly through the circuit board, the contacting opening being provided for electrical press-fit contacting of the press-fit pin, and wherein the contacting opening has a metallized inner wall;
    providing at least one electrically conductive press-fit pin having a longitudinal axis and a press-fit region suitable for press-fitting into the contacting opening, the press-fit region having a substantially round cross section;
    press-fitting the press-fit pin into the contacting opening by applying onto the press-fit pin a force acting along the longitudinal axis of the press-fit pin;
    wherein the contacting opening has a shape which deviates from a round shape and has a first inside diameter and a second inside diameter, the second inside diameter being smaller than the first inside diameter, the ratio of the first inside diameter to the second inside diameter being greater than 1.2, and wherein the press-fit region of the press-fit pin has, along a longitudinal axis of the press-fit pin over an axial length of at least 50% of the thickness of the circuit board, an outside diameter which (i) exceeds the second inside diameter of the contacting opening before press-fitting of the press-fit pin, and (ii) is smaller than the first inside diameter.

2. The method for solderless electrical press-fit contacting as recited in claim 1, wherein the press-fit pin is one of elastically or permanently deformable in a radial direction.

3. The method for solderless electrical press-fit contacting as recited in claim 1, wherein the electrical contact between the press-fit pin and the inner wall of the contacting opening has, after press-fitting, an electrical contact resistance of less than 50 μohm.

4. The method for solderless electrical press-fit contacting as recited in claim 1, wherein a component having a plurality of press-fit pins is provided, the plurality of press-fit pins being disposed in at least one row, and wherein the circuit board has multiple contacting openings which correspond at least to the number of press-fit pins of the component, the first inside diameter of the contacting openings being disposed respectively in the extension direction of the at least one row of press-fit pins.

5. The method for solderless electrical press-fit contacting as recited in claim 1, wherein the at least one press-fit pin is press-fitted obliquely into the contacting opening at an angle of between 10° and 80° with respect to a direction extending perpendicular to the circuit board.

6. The method for solderless electrical press-fit contacting as recited in claim 1, wherein the metallization of the inner wall of the at least one contacting opening has at least 25 μm of copper at every point.

7. The method for solderless electrical press-fit contacting as recited in claim 1, wherein the top-most layer of the metallization of the at least one contacting opening is made of tin.

8. The method for solderless electrical press-fit contacting as recited in claim 1, wherein the at least one contacting opening is expanded by press-fitting, the second inside diameter of the at least one contacting opening being at least locally enlarged by at most 100 μm.

9. The method for solderless electrical press-fit contacting as recited in claim 1, wherein press-fitting is assisted by application of ultrasound acting on the press-fit pin.

10. The method for solderless electrical press-fit contacting as recited in claim 9, wherein as a result of the application of ultrasound upon press-fitting, a friction weld is produced at least locally between an outer wall of the at least one press-fit pin and the inner wall of the at least one contacting opening.

* * * * *